(12) United States Patent
Yoon

(10) Patent No.: US 12,206,006 B2
(45) Date of Patent: Jan. 21, 2025

(54) SEMICONDUCTOR DEVICE AND METHOD FOR FABRICATING THE SAME

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 593 days.

(21) Appl. No.: 17/502,652

(22) Filed: Oct. 15, 2021

(65) Prior Publication Data
US 2022/0367661 A1 Nov. 17, 2022

(30) Foreign Application Priority Data
May 17, 2021 (KR) ................. 10-2021-0063227

(51) Int. Cl.
| | | |
|---|---|---|
| *H01L 21/02* | (2006.01) | |
| *H01L 29/40* | (2006.01) | |
| *H01L 29/45* | (2006.01) | |
| *H01L 29/78* | (2006.01) | |

(52) U.S. Cl.
CPC ............ *H01L 29/45* (2013.01); *H01L 29/401* (2013.01); *H01L 29/452* (2013.01); *H01L 29/456* (2013.01); *H01L 21/02529* (2013.01); *H01L 21/02631* (2013.01); *H01L 29/78* (2013.01)

(58) Field of Classification Search
CPC ..... H01L 29/401; H01L 29/45; H01L 29/452; H01L 29/456; H01L 29/78; H01L 21/02529; H01L 21/02631
USPC .......................................... 257/288
See application file for complete search history.

(56) References Cited

U.S. PATENT DOCUMENTS

| | | | | |
|---|---|---|---|---|
| 6,329,681 | B1 * | 12/2001 | Nakamura | ........ H01L 21/32053 257/E21.507 |
| 9,543,438 | B2 | 1/2017 | Tsai et al. | |
| 2014/0242506 | A1 * | 8/2014 | Shirasuna | ................ G03G 5/08 430/57.1 |
| 2015/0357285 | A1 * | 12/2015 | Cao | ................... H01L 21/02126 438/786 |

FOREIGN PATENT DOCUMENTS

KR 100942965 B1 2/2010

* cited by examiner

*Primary Examiner* — Monica D Harrison
(74) *Attorney, Agent, or Firm* — IP & T GROUP LLP

(57) ABSTRACT

Embodiments of the present invention provide a semiconductor device capable of improving both the thermal stability and contact resistance and a method for fabricating the same. According to an embodiment of the present invention, a semiconductor device may comprise: a contact plug over a substrate, wherein the contact plug includes: a silicide layer having a varying carbon content in a film, and a metal material layer over the silicide layer.

21 Claims, 10 Drawing Sheets

SEMICONDUCTOR DEVICE AND METHOD FOR FABRICATING THE SAME

CROSS-REFERENCE TO RELATED APPLICATIONS

The present application claims priority to Korean Patent Application No. 10-2021-0063227, filed on May 17, 2021, which is herein incorporated by reference in its entirety.

BACKGROUND

1. Field

The present invention relates to a semiconductor and a method for fabricating the semiconductor device, and more particularly, to a semiconductor device including a contact plug and a method for fabricating the same.

2. Description of the Related Art

In fabricating a contact structure of a semiconductor device, an ohmic contact is formed to suppress an increase in leakage current and contact resistance. As a known art, a silicide layer is formed to form an ohmic contact.

SUMMARY

Various embodiments of the present invention provide a semiconductor device capable of improving both the thermal stability and contact resistance. Various embodiments of the present invention provide a method for fabricating a contact plug for a semiconductor device and of a semiconductor device including the same.

According to an embodiment of the present invention, a semiconductor device comprises: a contact plug over a substrate, wherein the contact plug includes: a silicide layer having a varying carbon content in a film, and a metal material layer over the silicide layer.

According to another embodiment of the present invention, a semiconductor device comprises: a gate structure over a substrate; a source/drain region formed in the substrate on both sides of the gate structure; and a contact plug over the source/drain region, wherein the contact plug includes: a silicide layer having a varying carbon content in a film; and a metal material layer over the silicide layer.

According to an embodiment of the present invention, a method for fabricating a semiconductor device comprises: forming a plurality of silicon carbide layers, each of the silicon carbide layers having a different carbon content from each other over a substrate; forming a metal material layer over the plurality of the silicon carbide layers; and forming a contact plug in which a silicide layer and a metal material layer are stacked by reacting the plurality of the silicon carbide layers and the metal material layer through a heat treatment.

The present invention has the effect of improving the reliability of the semiconductor device by securing both thermal stability and contact resistance by facilitating the formation of silicide in the portion of the semiconductor device in contact with the contact plug and suppressing the overgrowth of silicide in the portion in contact with the substrate.

DETAILED DESCRIPTION

Figure 1:
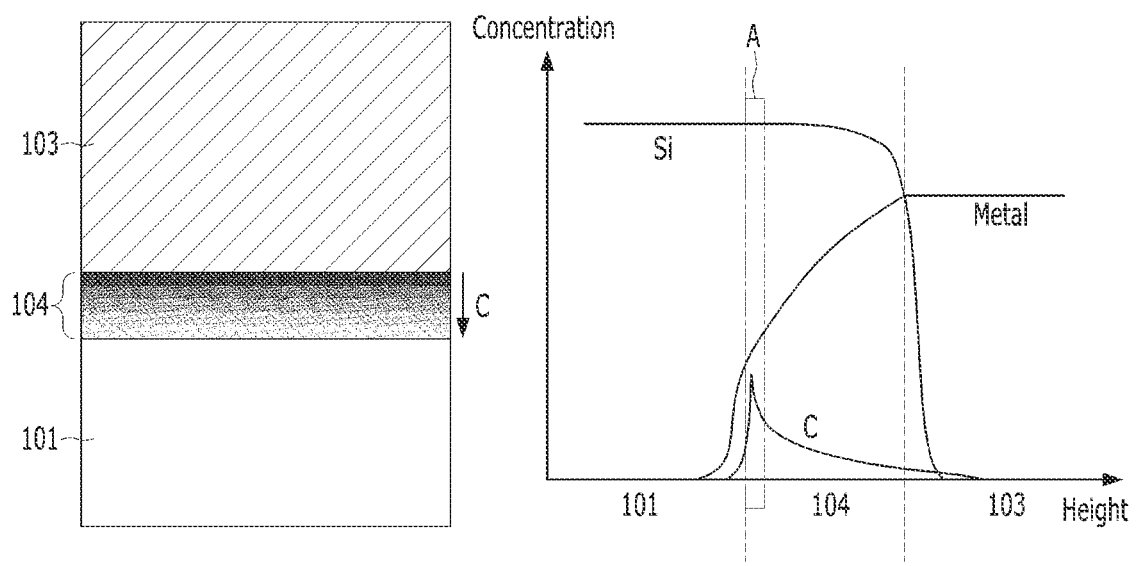
FIG. 1 is a diagram illustrating a contact plug according to an embodiment of the present invention.

Various embodiments are described herein with reference to cross-sectional views, plane views and block diagrams, which are schematic views of the present invention. Therefore, the structures of the drawings may be modified by fabricating technology and/or tolerances. The embodiments of the present invention are not limited to the specific structures shown in the drawings, but may include any changes in the structures that may be produced according to a fabricating process. Also, any regions and shapes of regions illustrated in the drawings having schematic views are intended to illustrate specific examples of structures of regions of the various elements, and are not intended to limit the scope of the invention.

FIG. 1 is a diagram illustrating a contact plug according to an embodiment of the present invention.

As shown in FIG. 1, a contact plug including a silicide layer 104 and a metal material layer 103 may be formed on a substrate 101. The silicide layer 104 and the metal material layer 103 may be stacked on each other to form a stack that is disposed on the substrate 101. The silicide layer 104 may have a varying carbon content. The silicide layer 104 may have a varying carbon content in a film depending upon the distance of the film from an outermost surface of the silicide layer 104. The substrate 101 may include various doping configurations depending on fabrication specifications. The substrate 101 may include other semiconductors such as germanium, silicon carbide (SiC), silicon germanium (SiGe), or diamond. The substrate 101 may include a compound semiconductor and/or alloy semiconductor. The substrate 101 may include a III-V group semiconductor substrate. The substrate 101 may include a compound semiconductor substrate such as gallium arsenide (GaAs), indium arsenide (InAs), or indium phosphide (InP). The substrate 101 may include a SOI (Silicon On Insulator) substrate. The substrate 101 may include a conductive region, for example, an impurity doped well and an impurity doped channel, or an impurity doped structure.

The silicide layer 104 may contact the substrate 101. The substrate 101 in contact with the silicide layer 104 may be a region doped with an impurity. The silicide layer 104 may include a metal silicide. The silicide layer 104 may be applied to prevent contamination and deep level impurity problems caused by the direct contact of the metal material layer 103, which forms the contact plug, with the substrate 101. Accordingly, excellent contact characteristics can be secured, and device characteristics and reliability can be improved because a metal having a significantly lower resistance than silicon can be used as a contact material.

As shown in the diagram of FIG. 1, the carbon content of the silicide layer may increase from the interface with the metal layer to the interface with the substrate. The silicide layer 104 may have a higher carbon content in a film at a portion closer to the substrate 101. The carbon content of the silicide layer 104 may be highest at an interface with the substrate 101. The carbon content of the silicide layer 104 may be lowest at an interface with the metal material layer 103.

The carbon content may be similar to the metal content in the silicide layer 104 at an interface with the substrate 101. At the interface with the substrate 101, the silicon content may be significantly higher than the carbon and metal contents in the silicide layer 104. Accordingly, Si—C bonding may be formed at the interface with the substrate 101, thereby securing a thermal stability of a semiconductor device.

At the interface with the substrate 101, the carbon content in the silicide layer 104 may be adjusted not to be higher than the metal content in the silicide layer 104. This adjustment is to prevent the formation of an unintended material layer and a sharp increase in resistance that may occur when the carbon content is higher than the metal content in the silicide layer 104. In addition, overgrowth of the silicide layer 104 may be suppressed even in the high-temperature heat treatment that is essential during the semiconductor process.

In the silicide layer 104, a thickness of a portion where the carbon content and the metal content are similar may be adjusted to be smaller than a thickness of a portion where the metal content is greater than the carbon content. In the silicide layer 104, a ratio of the thickness of a portion where the metal content is greater than the carbon content and the thickness of a portion where the carbon content and the metal content are similar may be adjusted to be greater than 4:1. In the silicide layer 104, a thickness of a portion where the carbon content is similar to the metal content may be adjusted to be less than 10 Å. That is because dopant injection may be difficult when a thickness of a portion where the carbon content is similar to the metal content is greater than 10 Å in the silicide layer 104. In addition, the resistance improvement effect of the silicide layer 104 may be maintained because the metal content is higher than the carbon content in most portions of the silicide layer 104.

The metal material layer 103 may act as a contact material. Using a metal material as a contact material is more advantageous than using a silicon because the specific resistance of metal is about 1000 times lower than that of silicon. In addition, there is no dopant diffusion from the contact plug to the substrate 101 because dopant ion implantation is not required. Therefore, the influence of the dopant on the refresh characteristics may be excluded. The metal material layer 103 may include a metal material capable of forming silicide. The metal material layer 103 may include metals capable of forming a silicide such as titanium (Ti), ruthenium (Ru), molybdenum (Mo), cobalt (Co), nickel (Ni), tantalum (Ta), and nickel-platinum (NiPt), but the invention may is not be limited in this way.

Figure 2A:
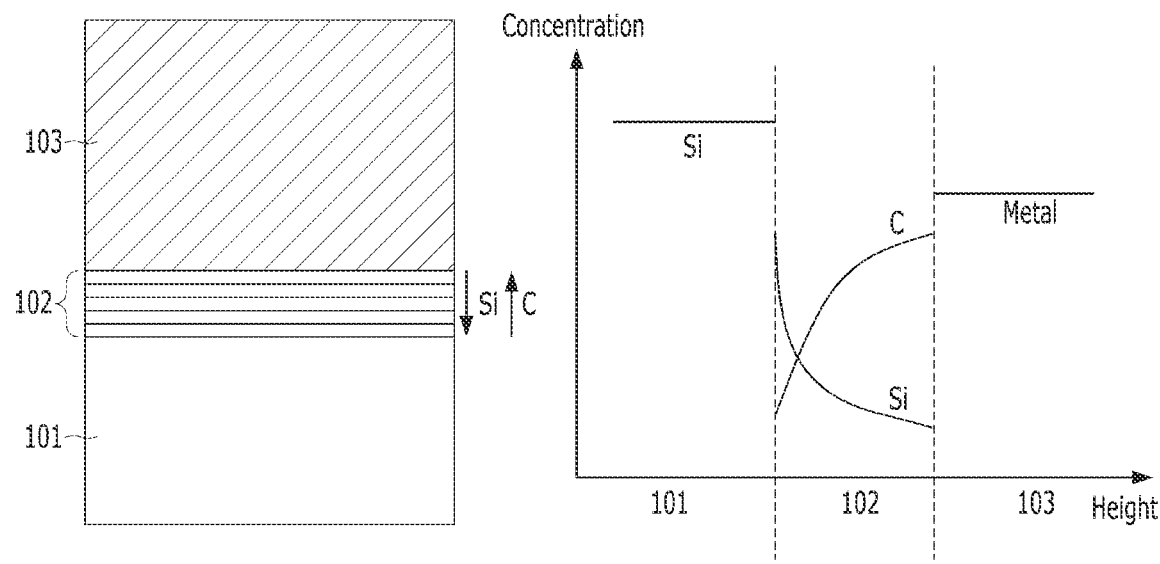
FIGS. 2A and 2B are diagrams illustrating a method for fabricating a contact plug according to an embodiment of the present invention.
Figure 2B:
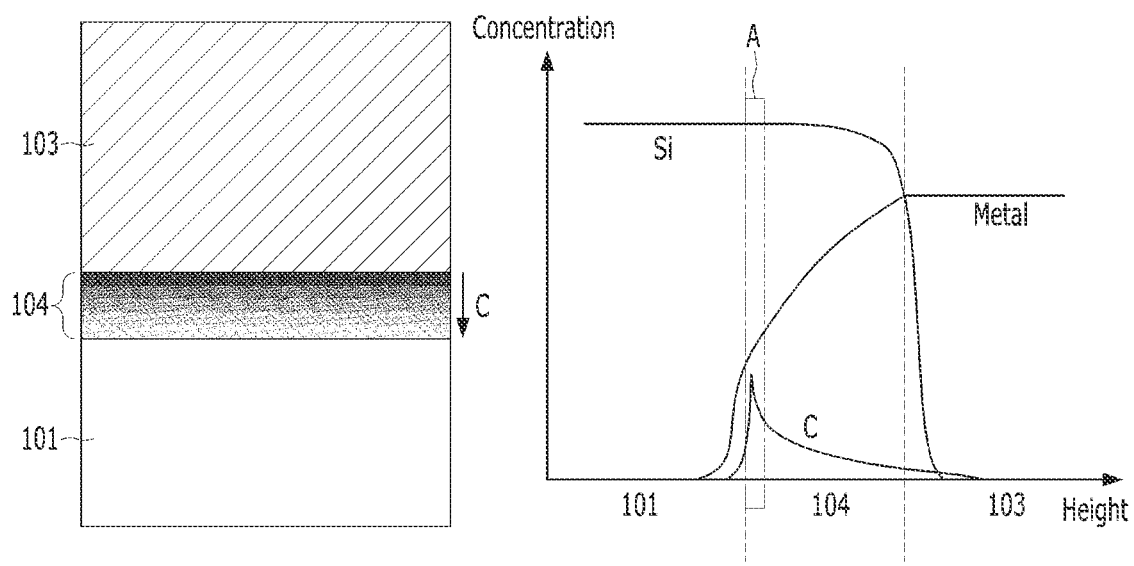

FIGS. 2A and 2B are diagrams illustrating a method for fabricating a contact plug according to an embodiment of the present invention. FIGS. 2A and 2B include the substrate 101 and metal material layer 103 identical to the one shown in FIG. 1. Descriptions on the substrate 101 and the metal material layer 103 may be omitted below.

As shown in FIG. 2A, a plurality of silicon carbide layers 102 having different carbon contents may be formed on the substrate 101. Each of the plurality of silicon carbide layers 102 may be formed to have the same thickness. In another embodiment, each of the plurality of silicon carbide layers 102 may have a different thickness from each other. According to the present embodiment, a stack of five silicon carbide layers 102 are illustrated. However, the present invention is not limited thereto and a stack of more than five silicon carbide layers 102 may be formed.

As shown in the graph of FIG. 2A, the silicon content in the plurality of the silicide layers 102 may increase as it approaches the substrate 101 and the carbon content in the plurality of the silicide layers 102 may increase as it approaches the metal material layer 103. That is, a silicon carbide layer 102 closest to the substrate 101 may have the highest silicon content and a silicon carbide layer 102 closest to the metal material layer 103 may have the highest carbon content in a film among the plurality of silicon carbide layers 102.

The plurality of silicon carbide layers 102 may be formed by a sputtering process, but the invention may not be limited in this way. The sputtering process may be performed by one selected from among a dual target, a dual material target, or a dual material/dual target. The dual target applies two materials as sputtering targets, and may include a silicon material (Si) and a carbon material (C). The dual material target applies a single material as a sputtering target, but the single material may include both silicon and carbon. In the dual material/dual target, two materials including both silicon and carbon may be dually applied. In this case, the two materials may have different composition ratios of silicon and carbon in a film. The sputtering process for forming the plurality of silicon carbide layers 102 may be performed by changing power, pressure, and stacking thickness, depending on an embodiment.

As shown in FIG. 2B, a silicide layer 104 may be formed between the substrate 101 and the metal material layer 103 by performing a heat treatment.

The silicide layer 104 may be formed by a reaction between the silicon carbide layers 102 and a metal inside the metal material layer 103 shown in FIG. 2B by heat treatment. The silicide layer 104 may include a metal silicide. The silicide layer 104 may be applied to prevent contamination and deep level impurity problems caused by the direct contact of the metal material layer 103, which forms the contact plug, with the substrate 101. Accordingly, excellent contact characteristics can be secured, and device characteristics and reliability can be improved because a metal having a significantly lower resistivity than silicon can be used as a contact material.

As shown in the graph of FIG. 2B, the silicide layer 104 may have a higher carbon content in a film at a portion closer to the substrate 101. The carbon content in the silicide layer 104 may be highest at an interface with the substrate 101. The silicide layer 104 may have the lowest carbon content at an interface with metal material layer 103.

The silicide layer 104 may have the carbon content similar to the metal content at an interface with the substrate 101. At the interface with the substrate 101, the silicon content may be significantly higher than the carbon and metal contents in the silicide layer 104. Accordingly, Si—C bonding may be formed at the interface with the substrate 101, thereby securing a thermal stability of a semiconductor device.

At the interface with the substrate 101, the carbon content in the silicide layer 104 may be adjusted not to be higher than the metal content in the silicide layer 104. This adjustment is made to prevent the formation of an unintended material layer and a sharp increase in resistance that may occur when the carbon content is higher than the metal content in the silicide layer 104. In addition, overgrowth of the silicide layer 104 may be suppressed even in the high-temperature heat treatment that is essential during the semiconductor process.

In the silicide layer 104, a thickness of a portion where the carbon content and the metal content are similar may be adjusted to be smaller than a thickness of a portion where the metal content is greater than the carbon content. In the silicide layer 104, a ratio of a thickness of a portion where the metal content is greater than the carbon content and a thickness of a portion where the carbon content and the metal content are similar may be adjusted to be greater than 4:1. In the silicide layer 104, a thickness of a portion where the carbon content is similar to the metal content may be adjusted to be less than 10 Å. That is because dopant injection may be difficult in the silicide layer 104 when a thickness of a portion where the carbon content is similar to the metal content is greater than 10 Å. In addition, the resistance improvement effect of the silicide layer 104 may be maintained because the metal content is higher than the carbon content in most portions of the silicide layer 104.

Figure 3:
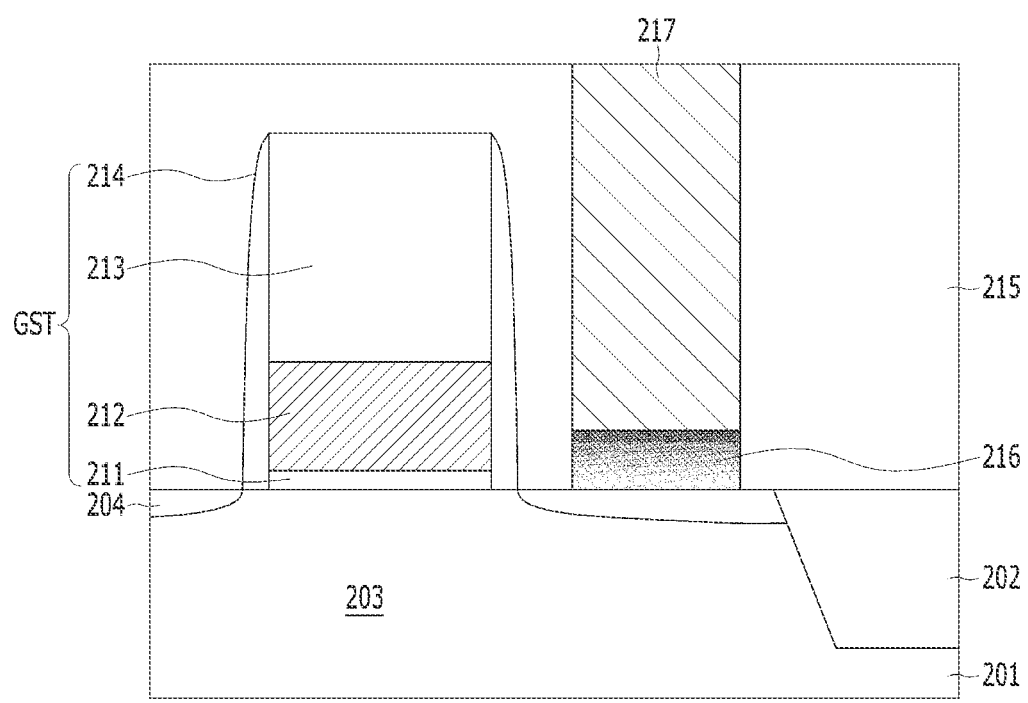
FIG. 3 is a diagram illustrating a semiconductor device according to an embodiment of the present invention.

FIG. 3 is a diagram illustrating a semiconductor device according to an embodiment of the present invention.

Referring to FIG. 3, the semiconductor device may include a gate structure GST formed on a substrate 201, source/drain regions 204 formed in the substrate 201 on both sides of the gate structure GST, an interlayer dielectric layer 215 covering the upper portion of the substrate 201 including the gate structure GST, a silicide layer 216 penetrating through the interlayer dielectric layer 215 and connecting to the source/drain regions 204, and a metal material layer 217 formed on the silicide layer 216.

The substrate 201 may include a semiconductor substrate such as silicon substrate. The substrate 201 may be formed of a silicon-containing material. The substrate 201 may include various doping configurations depending on fabrication specifications. The substrate 201 may include other semiconductors such as germanium, silicon carbide (SiC), silicon germanium (SiGe), or diamond. The substrate 201 may include a compound semiconductor and/or alloy semiconductor. The substrate 201 may include a III-V group semiconductor substrate. The substrate 201 may include a compound semiconductor substrate such as gallium arsenide (GaAs), indium arsenide (InAs), or indium phosphine (InP). The substrate 201 may include a SOI (Silicon On Insulator) substrate. The substrate 201 may include a conductive region such as an impurity doped well and an impurity doped channel, or an impurity doped structure.

The substrate 201 may include an active region 203 defined by device isolation layer 202. The device isolation layer 202 may be formed by STI (Shallow Trench Isolation) process. For example, a dielectric material may fill a trench after the trench is formed on the substrate 201. The device isolation layer 202 may include a silicon oxide, silicon nitride, or a combination thereof.

The gate structure GST may include a stacked structure of a gate dielectric layer 211, a gate electrode 212, and a gate hard-mask 213, and gate spacers 214 formed on sidewalls of the stacked structure. The gate dielectric layer 211 may include a silicon oxide, silicon nitride, silicon oxynitride, or a high-k material. The gate electrode 212 may include a silicon-containing material or a metal-containing material. The gate electrode 212 may include, for example, polysilicon, tungsten, tungsten silicide, titanium nitride, tantalum nitride, or a combination thereof. The gate electrode 212 may include an impurity-doped polysilicon, that is a doped polysilicon. An impurity may include an N-type impurity or P-type impurity. An impurity may include boron, arsenic, or a combination thereof. The gate hard-mask 213 may include a dielectric material. The gate hard-mask 213 may include, for example, silicon nitride. The gate spacer 214 may include a dielectric material. The gate spacer 214 may include, for example, silicon nitride.

The source/drain regions 204 may be formed on the substrate 201 on both sides of the gate structure GST. The source/drain regions 204 may be doped with the same impurity. The source/drain regions 204 may include an N-type or P-type impurity. The source/drain region 204 may be a region doped with a high content impurity.

The interlayer dielectric layer 215 may include a low-k material. The interlayer dielectric layer 215 may include, for example, one selected from among silicon oxide, silicon nitride, or a low-k material including silicon carbon and boron.

The silicide layer 216 may have the same configuration as the silicide layer 104 of FIG. 1. That is, the silicide layer 216 may have the same carbon content in a film as that of the silicide layer 104 of FIG. 1. The silicide layer 216 may contact the source/drain regions 204. The silicide layer 216 may include metal silicide. The silicide layer 216 may be applied to prevent contamination and deep level impurity problems caused by the direct contact of the metal material layer 217, which forms the contact plug, with the substrate 201. Accordingly, excellent contact characteristics can be secured, and device characteristics and reliability can be improved because a metal having a significantly lower resistance than silicon can be used as a contact material.

The carbon content in the silicide layer 216 may increase as it approaches the substrate 201. The carbon content in the silicide layer 216 may be highest at the interface with the substrate 201. The silicide layer 216 may have the lowest carbon content at the interface with the metal material layer 217.

The carbon content in the silicide layer 216 at the interface with the substrate 201 may be similar to the metal content in the silicide layer 216. The silicon content in the silicide layer 216 may be significantly higher than the carbon and metal contents at the interface with the substrate 201. Accordingly, Si—C bonding may be formed at the interface with the substrate 201, and consequently, thermal stability of the semiconductor device may be secured.

The carbon content in the silicide layer 216 at the interface with the substrate 201 may be adjusted not to be higher than the metal content in the silicide layer 216. This is because, when the carbon content in the silicide layer 216 is higher than the metal content, an unintended material layer may be formed and the resistance may be sharply increased. In addition, overgrowth of the silicide layer 216 may be suppressed even in the high-temperature heat treatment that is essential during the semiconductor process.

In the silicide layer 216, a thickness of a portion having a carbon content similar to a metal content may be adjusted to be smaller than a thickness of a portion having a metal content greater than a carbon content. In the silicide layer 216, the thickness of a portion having a greater metal content than a carbon content and the thickness of a portion having similar contents of carbon and metal may be adjusted to be at least 4:1 or more. In the silicide layer 216, a thickness of a portion having similar contents of carbon and metal may be adjusted to be less than 10 Å. This is because dopant injection may be difficult when the thickness of a portion in the silicide layer 216 having similar contents of carbon and metal is 10 Å or more. In addition, the resistance improvement effect of the silicide layer 216 may be maintained because most portions of the silicide layer 216 have a higher content of metal than that of carbon.

The metal material layer 217 may act as a contact material. Using a metal material as a contact material is more advantageous than using a silicon in terms of resistance because the specific resistance of metal is about 1000 times lower than that of silicon. In addition, there is no dopant diffusion from the contact plug to the substrate 201 because dopant ion implantation is not required, and thus, the influence of the dopant on the refresh characteristics may be excluded. The metal material layer 217 may include a metal material capable of forming silicide. For example, the metal material layer 217 may include a metal material capable of forming a silicide such as titanium (Ti), ruthenium (Ru), molybdenum (Mo), cobalt (Co), nickel (NI), tantalum (Ta), and nickel-platinum (NiPt), but the invention may not be limited in this way.

Figure 4:
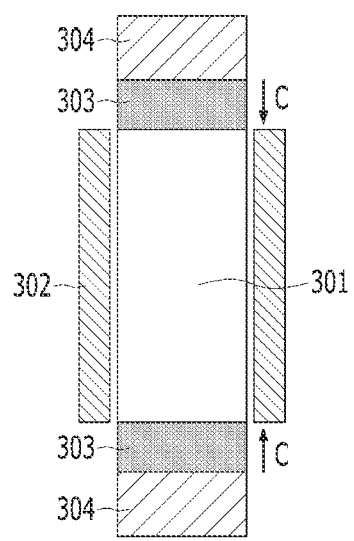
FIG. 4 is a diagram illustrating a semiconductor device according to another embodiment of the present invention.

FIG. 4 is a diagram illustrating a semiconductor device according to another embodiment of the present invention.

Referring to FIG. 4, the semiconductor device may include a vertical gate structure. The vertical gate structure may include a vertical channel 301 and gate electrodes 302 spaced apart from both sides of the vertical channel 301. A contact plug includes a silicide layer 303 having a varying carbon content in the film and a metal material layer 304 stacked thereon. The contact plug may be in contact with both ends of the vertical channel 301. Both ends of the vertical channel 301 in contact with the silicide layers 303 may include an impurity doped region. The silicide layer 303 may be a metal silicide layer as the silicide layer 104 of FIG. 1. The silicide layer 303 may have the same configuration as the silicide layer 104 of FIG. 1. That is, the silicide layer 303 may have the same varying carbon content as that of the silicide layer 104 of FIG. 1.

FIGS. 5A to 5E are diagrams illustrating a method for fabricating a semiconductor device according to an embodiment of the present invention.

Figure 5A:
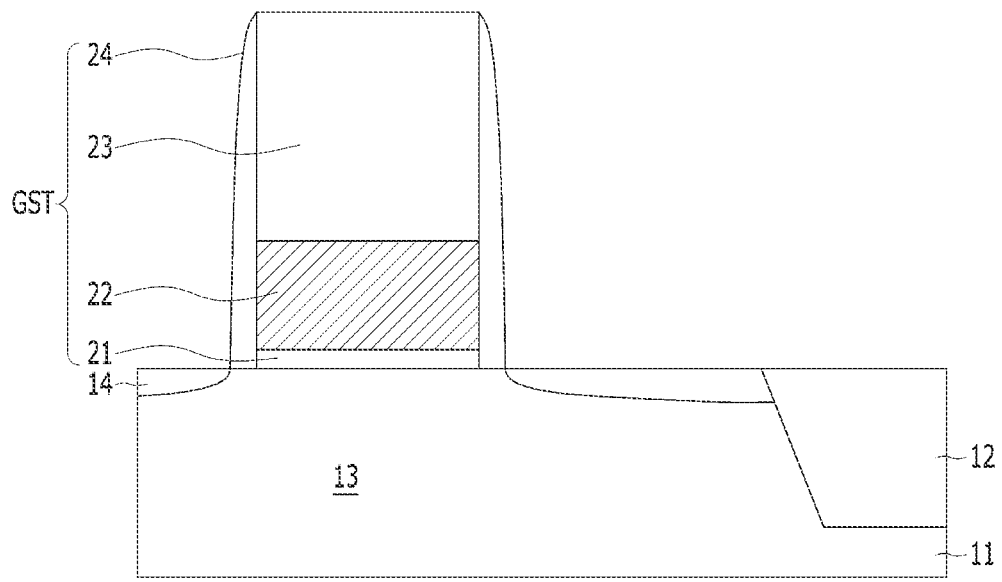
FIGS. 5A to 5E are diagrams illustrating a method for fabricating a semiconductor device according to an embodiment of the present invention.

As shown in FIG. 5A, a gate structure GST may be formed on a substrate 11. The gate structure GST may be formed on an active region 13 of the substrate 11. The active region 13 may be defined by a device isolation layer 12.

The substrate 11 may include a semiconductor substrate such as a silicon substrate. The substrate 11 may be made of a silicon-containing material. The substrate 11 may include various doping configurations depending on fabrication specifications. The substrate 11 may include germanium, silicon carbide (SiC), silicon germanium (SiGe), or another semiconductor such as diamond. The substrate 11 may include a compound semiconductor and/or an alloy semiconductor. The substrate 11 may include a III-V group semiconductor substrate. The substrate 11 may include a compound semiconductor substrate such as gallium arsenide (GaAs), indium arsenide (InAs), or indium phosphine (InP). The substrate 11 may include a silicon on insulator (SOI) substrate. The substrate 11 may include a conductive region, for example, an impurity doped well and an impurity doped channel, or a structure doped with an impurity.

The device isolation layer 12 may be formed by a shallow trench isolation (STI) process. For example, after the trench is formed in the substrate 11, the trench may be filled with a dielectric material. The device isolation layer 12 may include, for example, silicon oxide, silicon nitride, or a combination thereof.

The gate structure GST may include a stacked structure of a gate dielectric layer 21, a gate electrode 22, a gate hard-mask 23 and gate spacers 24 formed on sidewalls of the stacked structure. The gate structure GST may be formed through a series of processes of sequentially stacking a gate dielectric material, a gate electrode material, and a gate hard-mask material on the substrate 11, forming a mask pattern on the gate hard-mask material, forming a stacked structure by sequentially etching the gate hard-mask material, the gate electrode material, and the gate dielectric material using the mask pattern as an etching mask, and forming the gate spacers 24 on both sidewalls of the stacked structure.

The gate dielectric layer 21 may include, for example, silicon oxide, silicon nitride, silicon oxynitride, or a high-k material. The gate electrode 22 may include a silicon-containing material or a metal-containing material. The gate electrode 22 may include, for example, polysilicon, tungsten, tungsten silicide, titanium nitride, tantalum nitride, or a combination thereof. The gate electrode 22 may include an impurity-doped polysilicon, that is a doped polysilicon. An impurity may include an N-type or P-type impurity. An impurity may include boron, arsenic, or a combination thereof. The gate hard-mask 23 may include a dielectric material. The gate hard-mask 23 may include, for example, silicon nitride. The gate spacer 24 may include a dielectric material. The gate spacer 24 may include, for example, silicon nitride.

Then, the source/drain regions 14 may be formed by doping the substrate 11 on both sides of the gate structure GST with impurities. The source/drain regions 14 may include an N-type impurity or a P-type impurity. The source/drain region 14 may be a region doped with a high content impurity.

Figure 5B:
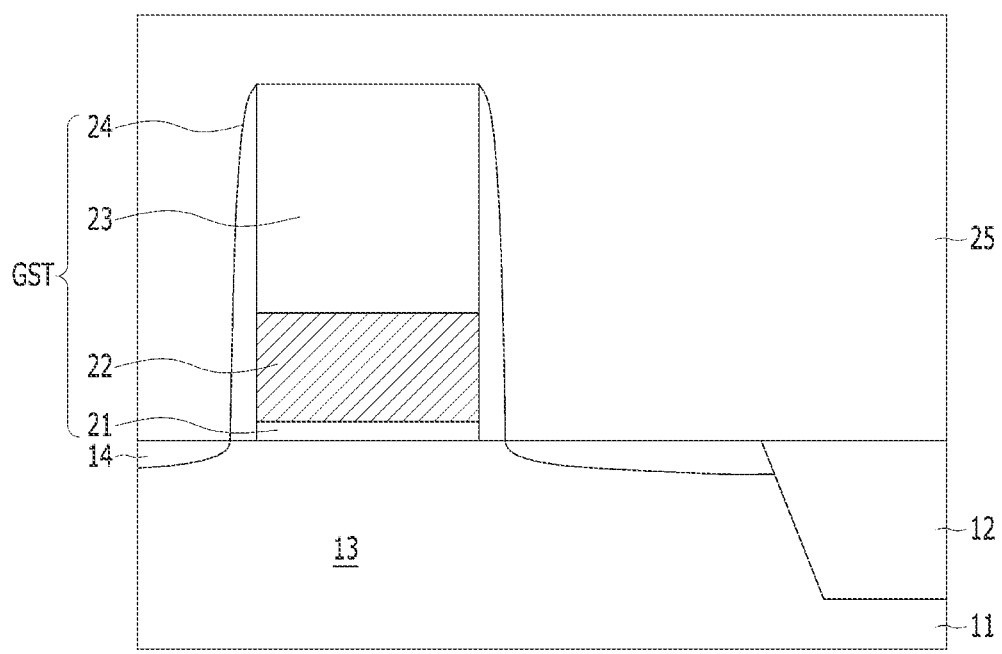

As shown in FIG. 5B, an interlayer dielectric layer 25 covering an upper portion of the substrate 11 including the gate structure GST may be formed. The interlayer dielectric layer 25 may act as an isolating layer separating adjacent gate structures GST, the gate structure GST and other conductive structures formed at the same level as the gate structure GST, and the gate structure GST and other conductive structures formed at the upper level of the gate structure GST.

The interlayer dielectric layer 25 may include a low-k material. The interlayer dielectric layer 25 may include, for example, one selected from among silicon oxide, silicon nitride, or a low-k material including silicon carbon and boron.

Figure 5C:
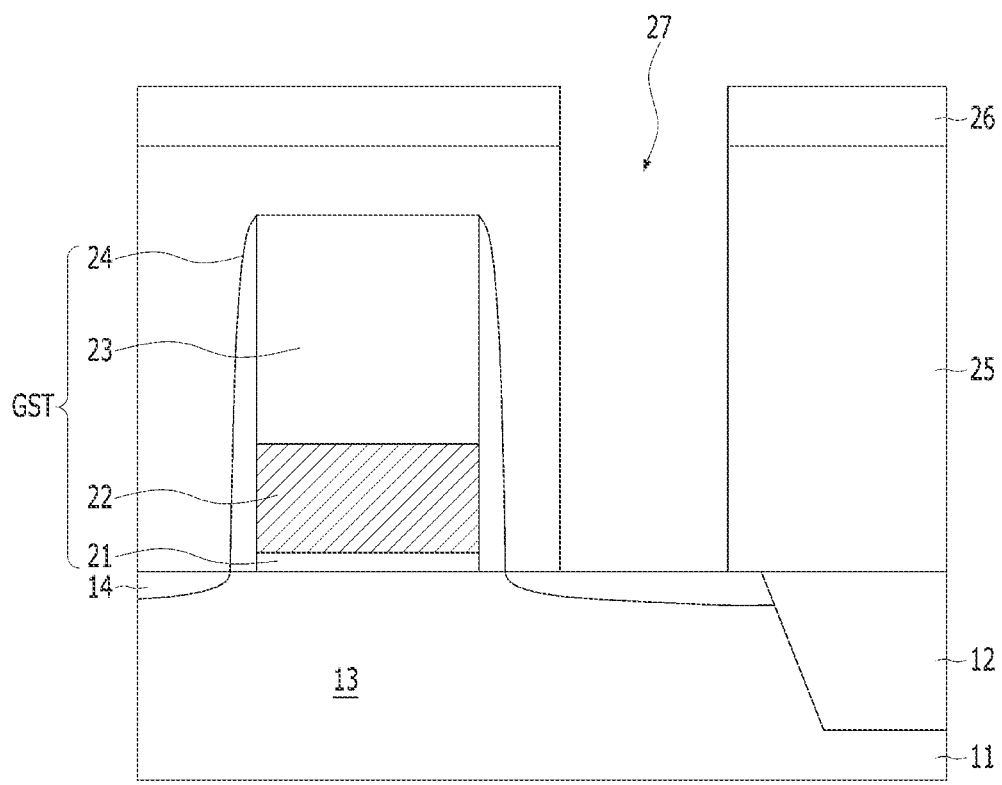

As shown in FIG. 5C, a mask pattern 26 may be formed on the interlayer dielectric layer 25. The mask pattern 26 may include a material having an etch selectivity with respect to the interlayer dielectric layer 25. The mask pattern 26 may be formed of a photoresist layer.

Then, the interlayer dielectric layer 25 may be etched using the mask pattern 26 as an etch mask. Accordingly, an open region 27 penetrating the interlayer dielectric layer 25 and exposing the source/drain region 14 may be formed.

Figure 5D:
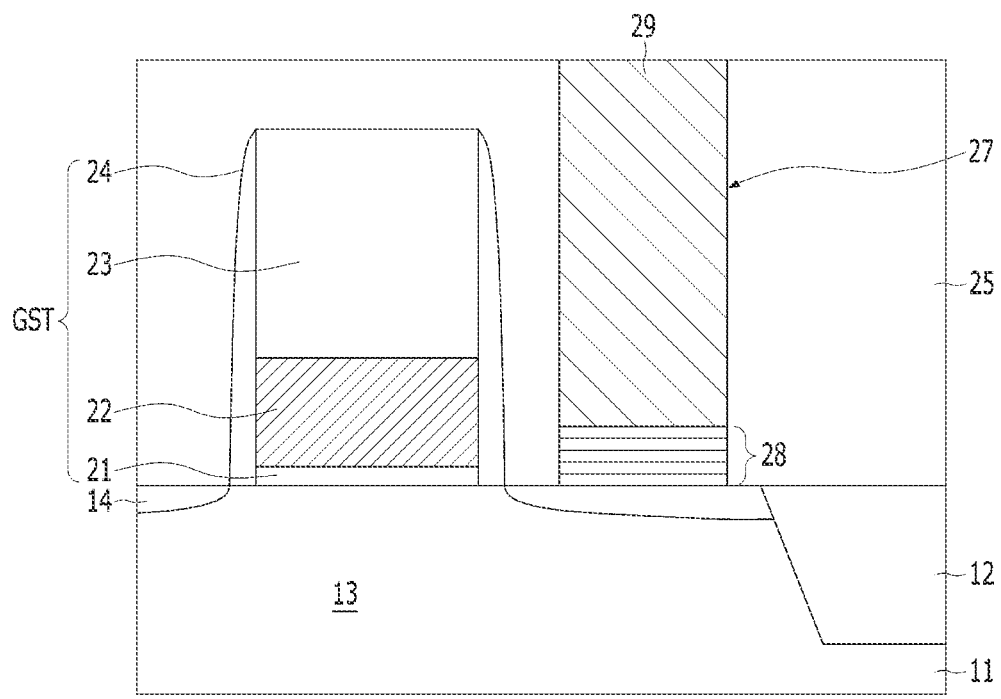

As shown in FIG. 5D, a contact plug including a plurality of silicon carbide layers 28 and a metal material layer 29 formed on the plurality of silicon carbide layers 28 may be formed by gap-filling the open region 27.

The plurality of the silicon carbide layers 28 may be formed on the source/drain region 14 exposed by the open region 27. The plurality of the silicon carbide layers 28 may have different carbon contents in each layer. The plurality of the silicon carbide layers 28 of FIG. 5D may have the same configuration as that of FIG. 2A.

Each of the plurality of silicon carbide layers 28 may be formed to have the same thickness. In another embodiment, each of the plurality of silicon carbide layers 28 may have a different thickness from each other. Although the plurality of silicon carbide layers 28 is illustrated to include five layers, the present invention is not limited thereto.

The silicon (Si) content in the plurality of silicon carbide layers 28 may increase as it approaches the substrate 11, and the carbon (C) content in the film may increase as it approaches the metal material layer 29. That is, a silicon carbide layer 28 closest to the substrate 11 may have the highest silicon content and a silicon carbide layer 28 closest to the metal material layer 29 may have the highest carbon content in a film among the plurality of the silicon carbide layers 28.

The plurality of silicon carbide layers 28 may be formed by a sputtering process, but the invention may not be limited in this way. The sputtering process may be performed by one of a dual target, a dual material target, or a dual material/dual target. The dual target applies two materials as sputtering targets, and may include a silicon material (Si) and a carbon material (C). A dual material target applies a single material as a sputtering target, but the single material may include both silicon and carbon. In the dual material/dual target, two materials including both silicon and carbon may be dually applied, and in this case, the two materials may have different composition ratios of silicon and carbon in a film. The sputtering process for forming the plurality of silicon carbide layers 28 may be performed by changing power, pressure, and stacking thickness, depending on embodiment.

The metal material layer 29 may include a metal material capable of forming silicide. For example, the metal material layer 29 may include silicide-forming metals such as titanium (Ti), ruthenium (Ru), molybdenum (Mo), cobalt (Co), nickel (Ni), tantalum (Ta), and nickel-platinum (NiPt), but the invention may not be limited in this way.

Figure 5E:
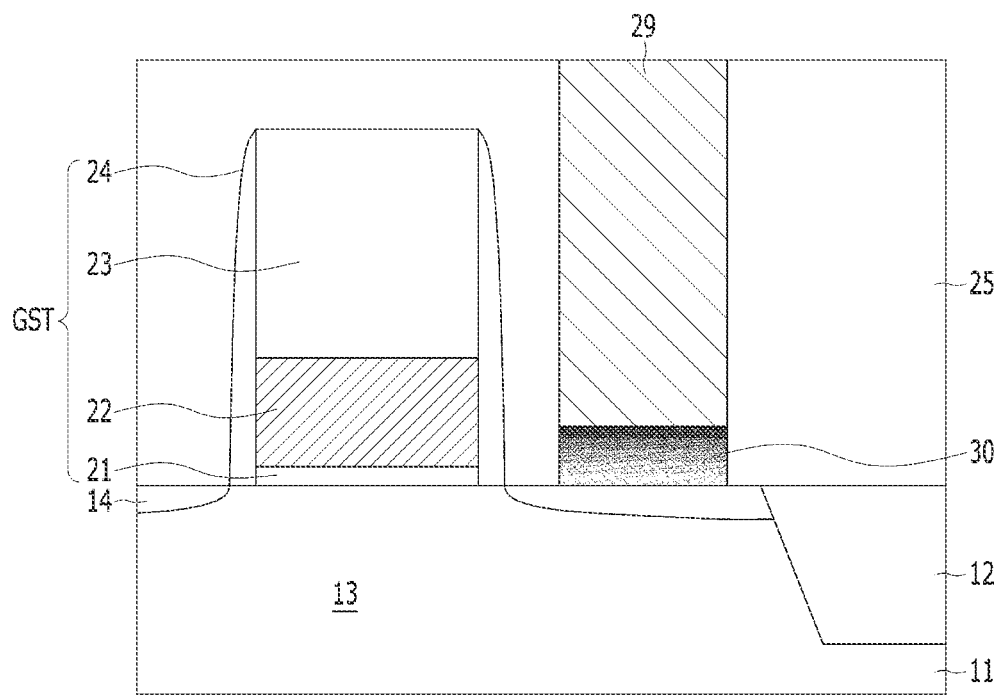

As shown in FIG. 5E, a silicide layer 30 may be formed between the substrate 11 and the metal material layer 29 by performing heat treatment.

The silicide layer 30 may be formed by a reaction between the silicon carbide layer 28 of FIG. 5D and a metal in the metal material layer 29 by heat treatment. The silicide layer 30 may include metal silicide. The silicide layer 30 may be applied to prevent contamination and deep level impurity problems caused by the direct contact of the metal material layer 29, which forms the contact plug, with the substrate 11. Accordingly, excellent contact characteristics can be secured, and device characteristics and reliability can be improved because a metal having a significantly lower resistance than silicon can be used as a contact material.

The carbon content in the silicide layer 30 may increase as it approaches the substrate 11. The carbon content in the silicide layer 30 may be highest at the interface with the substrate 11. The carbon content may be the lowest in the silicide layer 30 at the interface with the metal material layer 29.

The carbon content in the silicide layer 30 may be similar to the metal content in the silicide layer 30 at the interface with the substrate 11. The silicon content in the silicide layer 30 may be significantly higher than the carbon and metal contents at the interface with the substrate 11 (refer to FIG. 1). Accordingly, Si—C bonding may be formed at the interface with the substrate 11, and consequently, thermal stability of the semiconductor device may be secured.

The carbon content may be adjusted not to be higher than the metal content in the silicide layer 30 at the interface with the substrate 11. This adjustment is to prevent the formation of an unintended material layer and a sharp resistance increase that may occur when the carbon content is higher than the metal content in the silicide layer 30. In addition, overgrowth of the silicide layer 30 can be suppressed even in the high-temperature heat treatment that is essential during the semiconductor process.

In the silicide layer 30, a thickness at a portion having similar contents of carbon and metal may be adjusted to be smaller than a thickness at a portion having a greater metal content than a carbon content. In the silicide layer 30, a thickness at a portion having a greater content of metal than that of carbon and a thickness at a portion having similar contents of carbon and metal may be adjusted to be at least 4:1 or more. In the silicide layer 30, a thickness of a portion having similar contents of carbon and metal may be adjusted to be less than 10 Å. This is because dopant injection may be difficult when the thickness of a portion in the silicide layer 30 having similar contents of carbon and content of metal is 10 Å or more. In addition, the resistance improvement effect of the silicide layer 30 may be maintained because the metal content is higher than the carbon content in most portions of the silicide layer 30.

Although the technical features of the present invention have been shown and described with reference to specific embodiments thereof, it will be appreciated by one of ordinary skill in the art that various changes and modifications may be made thereto without departing from the scope of the disclosure.

What is claimed is:

1. A semiconductor device, comprising:
a contact plug over a substrate, wherein the contact plug includes:
a silicide layer having a varying carbon content in a film,
a metal material layer over the silicide layer, and
wherein the silicide layer is a single layer and is a conductive material,
wherein the carbon content of the silicide layer increases from the interface with the metal layer to the interface with the substrate.

2. The semiconductor device of claim 1, wherein the silicide layer includes a metal silicide.

3. The semiconductor device of claim 2, wherein the metal silicide includes a metal material identical to a metal material of the metal material layer.

4. The semiconductor device of claim 1, wherein a carbon content in the silicide layer is highest at an interface with the substrate.

5. The semiconductor device of claim 1, wherein a carbon content in the silicide layer is lowest at an interface with the metal material layer.

6. The semiconductor device of claim 1, wherein a carbon content does not exceed a metal content in the silicide layer at an interface with the substrate.

7. The semiconductor device of claim 1, wherein a silicon content is greater than carbon and metal contents in the silicide layer at an interface with the substrate.

8. A semiconductor device, comprising:
a gate structure over a substrate;
a source/drain region formed in the substrate on both sides of the gate structure; and
a contact plug over the source/drain region,
wherein the contact plug includes:
a silicide layer having a varying carbon content in a film;
a metal material layer over the silicide layer, and
wherein the silicide layer is a single layer and is a conductive material,
wherein the carbon content of the silicide layer increases from the interface with the metal layer to the interface with the substrate.

9. The semiconductor device of claim 8, wherein the silicide layer includes a metal silicide.

10. The semiconductor device of claim 9, wherein the metal silicide includes a metal material identical to a metal material of the metal material layer.

11. The semiconductor device of claim 8, wherein a carbon content in the silicide layer is highest at an interface with the substrate.

12. The semiconductor device of claim 8, wherein a carbon content in the silicide layer is lowest at an interface with the metal material layer.

13. The semiconductor device of claim 8, wherein a carbon content does not exceed a metal content in the silicide layer at an interface with the substrate.

14. The semiconductor device of claim 8, wherein a silicon content is greater than carbon and metal contents in the silicide layer at an interface with the substrate.

15. A method for fabricating a semiconductor device, the method comprising:
   forming a plurality of silicon carbide layers over a substrate, each of the silicon carbide layers having a different carbon content from each other;
   forming a metal material layer over the plurality of the silicon carbide layers;
   forming a contact plug in which a silicide layer and a metal material layer are stacked by reacting the plurality of the silicon carbide layers and the metal material layer through a heat treatment, and
   wherein the silicide layer is a single layer and is a conductive material,
   wherein the carbon content of the silicide layer increases from the interface with the metal layer to the interface with the substrate.

16. The method according to claim 15, wherein the plurality of the silicon carbide layers has a higher silicon content in a film closer to the substrate, and a higher carbon content in a film closer to the metal material layer.

17. The method according to claim 15, wherein a silicon carbide layer closest to the substrate has a highest silicon content in a film among the plurality of the silicon carbide layers, and a silicon carbide layer closest to the metal material layer has a highest carbon content among the plurality of the silicon carbide layers.

18. The method according to claim 15, wherein the forming of the plurality of the silicon carbide layers is performed by a sputtering process.

19. The method according to claim 18, wherein the sputtering process is performed with a dual target which applies each of a silicon material and a carbon material as a sputtering target.

20. The method according to claim 18, wherein the sputtering process is performed with a dual material target which applies a silicon carbide material as a sputtering target.

21. The method according to claim 18, wherein the sputtering process is performed with a dual material/dual target which applies two silicon carbide materials having different composition ratios as sputtering targets.

* * * * *